US006825734B2

(12) United States Patent
Clark

(10) Patent No.: US 6,825,734 B2
(45) Date of Patent: Nov. 30, 2004

(54) OSCILLATOR MODULE INCORPORATING SPIRAL LOOPED-STUB RESONATOR

(75) Inventor: Roger L. Clark, Windham, NH (US)

(73) Assignee: Phasor Technologies Corporation, Windham, NH (US)

( * ) Notice: Subject to any disclaimer, the term of this patent is extended or adjusted under 35 U.S.C. 154(b) by 0 days.

(21) Appl. No.: 10/706,895

(22) Filed: Nov. 13, 2003

(65) Prior Publication Data

US 2004/0100338 A1 May 27, 2004

Related U.S. Application Data

(60) Provisional application No. 60/425,766, filed on Nov. 13, 2002.

(51) Int. Cl.[7] .............................. H03B 5/18; H01P 7/00; H01P 7/08

(52) U.S. Cl. ..................... 331/96; 331/117 D; 331/179; 333/219

(58) Field of Search ............................... 331/96, 117 R, 331/117 FE, 117 D, 108 D, 107 DP, 107 SL, 177 R, 179, 181; 333/219, 235

(56) References Cited

U.S. PATENT DOCUMENTS

| | | | | |
|---|---|---|---|---|
| 5,140,286 A | | 8/1992 | Black et al. | |
| 5,373,262 A | * | 12/1994 | Yamamoto et al. | 331/96 |
| 5,381,117 A | * | 1/1995 | Okamura et al. | 333/175 |
| 6,140,884 A | | 10/2000 | Harpham et al. | |
| 6,268,778 B1 | | 7/2001 | Mucke et al. | |

* cited by examiner

*Primary Examiner*—David Mis
(74) *Attorney, Agent, or Firm*—Maine & Asmus

(57) ABSTRACT

A transmission line configured as a looped-stub resonator is disclosed, which can be used as a frequency selective element for an oscillator, such as a VCO of a phase locked loop. The transmission line is a fraction of an electrical wavelength, and can be embedded to provide an inner resonant layer of an overall layered structure. The transmission line is formed into a loop or multiple loops and may be terminated with a capacitor, short circuit, or open circuit. In the embedded case, dielectric insulating material can be used to surround the transmission line on top and bottom surfaces as layers. In addition, electrically conducting material layers can be used to surround the dielectric insulating material.

23 Claims, 5 Drawing Sheets

OSCILLATOR MODULE INCORPORATING SPIRAL LOOPED-STUB RESONATOR

RELATED APPLICATIONS

This application claims the benefit of U.S. Provisional Application No. 60/425,766 filed 13 Nov. 2002, which is herein incorporated in its entirety by reference.

FIELD OF THE INVENTION

The invention relates to voltage controlled oscillators, and more particularly, to an oscillator module incorporating a looped-stub resonator.

BACKGROUND OF THE INVENTION

Modern electronic systems often require a signal to be generated in the frequency range of a few MHz to thousands of MHz. Frequencies are generated through the use of oscillating circuitry and some form of frequency stabilizing resonant circuitry or element. A provision to control the frequency through a voltage is also generally provided and essential if the oscillator is to be used in a phase locked loop system (PLL). A basic PLL uses a voltage controlled oscillator (VCO) in conjunction with additional circuitry to control both the phase and frequency of the VCO. Various parameters such as cost, size, power, and other specifications are evaluated in determining the optimal design of the PLL.

In a conventional PLL, the output frequency is divided and the phase of this divided signal is compared to the phase of a reference signal input. An error signal proportional to the phase difference between the reference signal input and the divided output signal is generated by a phase detector circuit. This error signal is filtered and then used to control the frequency of the output frequency. The output frequency is equal to the input frequency multiplied by the division number.

The frequency divider may be programmable such that the output frequency become definable by the specific frequency division ratio. For example, if the input frequency is 10 MHz, and the output frequency is 1000 MHz, then the division ratio would be 100. If the division ratio is then changed to 90, then the output frequency would change to 900 MHz for the same 10 MHz input frequency. Various parameters such as the time necessary to perform the frequency change, along with the signal quality of the output frequency, are used to determine the proper design.

The circuitry used to filter the error signal from the phase detector is a low pass filter. This filter allows slowly varying voltages to pass on to the VCO, while attenuating high frequency or rapidly changing voltages. The bandwidth of the low-pass filter can vary from a few Hz to several MHz. For example, if it is desirable to rapidly switch between two frequencies, the low pass filter bandwidth is considerably larger. However, if a very pure output signal is required, then the low pass bandwidth can be narrower, with an attendant increase in switching time.

The performance of communication and instrumentation systems depends to a large degree on proper design and performance of phase locked loops. More specifically, the jitter and phase noise of the output frequency can affect many system specifications. Phase noise is a well-known impurity in frequency multiplication and synthesis. It is a measure of performance of the purity and stability of a signal. Phase noise is measured in the frequency domain and is expressed as the ratio of phase noise power to the signal power level in a 1 Hz bandwidth. For example, the phase noise of a 1000 MHz signal when measured at 100 kHz offset can be −160 dBc. Phase noise manifests in a number of ways in electronics systems. For example, phase noise in a PLL can mask the target signal in a radar system.

Jitter is closely related to phase noise and is a time domain parameter which describes the stability of a signal when measured over short periods of time. More specifically it is a parameter which describes the variation in the period of the signal over a defined measurement bandwidth. For example, the jitter of a 1000 MHz signal can be 1 ps over the bandwidth of 12 kHz to 20 MHz. Jitter can also be defined as a percentage of the total period of the signal. For the case of a 1000 MHz signal, the period will be reciprocal to the frequency, or 1 ns. Thus, 1 ps of jitter would be equivalent to 0.001 unit interval of one period. Jitter is an important parameter in communication systems and can induce error in the transmitted or received data.

A key attribute in the performance of a PLL is the phase noise of the VCO. At offset frequencies much less than the bandwidth of the low pass filter, the phase noise of the VCO will be related to the phase noise of the reference input with an additional contribution of 20 log (division ratio). For example, with a 10 MHz reference input and a 1000 MHz output, the phase noise at frequencies much less than the low pass filter bandwidth will be obtained from the input phase noise with an additional contribution of 60 dB. At frequencies much greater than the low pass filter bandwidth, the phase noise output signal will be directly related to the phase noise of the VCO. Therefore, the performance of the input reference signal, the VCO, and the low pass filter bandwidth all impact PLL performance.

The frequency of a VCO is primarily determined by the frequency of resonant elements. These elements must have some type of energy storage at a specific frequency. Common resonant elements are lumped element inductor-capacitor circuits and distributed resonant circuits. Phase noise of the VCO is determined to a large degree by the bandwidth of resonant elements in the VCO. The quality factor (Q) of the resonant circuit is determined by the amount of stored energy divided by the lost energy per cycle of resonance. An equivalent definition of Q is the ratio of the center frequency to the bandwidth of the resonant circuit. For example, a 1000 MHz VCO may have resonant circuit with a Q of 100.

In an oscillator, Q defines the offset frequency where phase noise begins to dramatically increase. Depending on circuit characteristics, the phase noise may increase by either 20 or 30 dB per decade at offset frequencies less than one half the center frequency divided by the Q. For the case of a 1000 MHz VCO with a Q of 100, the phase noise will begin to appreciably increase at frequencies less than 5 MHz.

In the case where inductors are integrated onto an integrated circuit (IC), substantial changes in frequency require a redesign of the IC. IC design and manufacture typically involve photolithographic techniques with circuit features determined by an optical mask. Redesign of an IC thus requires that at least one new photolithographic mask be created. Thus, one of the fundamental difficulties encountered in the design of PLLs and frequency synthesizers is obtaining adequate Q in the resonant circuitry of the VCO. Another difficulty is accomplishing the design associated with each new required frequency without the need to generate new photolithographic masks.

Distributed element resonant devices may also be used to stabilize the frequency of a VCO. The most common type is referred to as a stub, and is a straight line conductor surrounded by some type of insulating media and ground surface. The stub is a fraction of a wavelength and typically ¼ or ½ of a wavelength. The inductance of the conductor and capacitance to the ground surface or plane serve as energy storage elements. The Q of distributed element resonant devices is often higher than lumped element inductor-capacitor circuits.

Common distributed element resonators are coaxial, microstrip stubs, stripline stubs, ring resonators and disk resonators. While having sufficiently high Q, these devices are physically too large for many applications and are generally incompatible with chip scale types of packaging. Stub devices have become quite popular due to their simplicity of design and low cost of manufacture. However, stub type must have a length which is a fraction of a wavelength and can become excessively long. At frequencies of 2 GHz, this length may be 1 inch or even longer, depending on the material. In short, conventional tuning techniques suffer from performance limitations, and/or have resonators that are physically too large for a given application.

What is needed, therefore, is a PLL module capable of meeting performance requirements while maintaining miniature dimensions. Further, the module should be capable of meeting various frequency requirements with only minor changes, rather than requiring a new mask.

BRIEF SUMMARY OF THE INVENTION

One embodiment of the present invention provides a resonator device configured with an input port at one end and a termination at its other end, and for providing a frequency selective element for an oscillator. The device includes a substrate, and a fractional wavelength transmission line on a surface of the substrate. The transmission line is formed into one or more loops, thereby providing a looped-stub resonator structure. Each edge or side of the one or more loops provides a portion of the fractional wavelength (e.g., ¼ or ½ wavelength).

The termination can be, for example, a capacitor, a short circuit, or an open circuit. In one particular embodiment, the device is a structure having a number of layers, and the transmission line is located in an inner layer of the structure. In one such an embodiment, the inner layer is substantially surrounded by dielectric insulating material layers. Here, electrically conducting material layers connected to ground may surround the dielectric insulating material layers.

The device can be incorporated, for example, into a voltage controlled oscillator of a phase locked loop circuit. Other circuits may also benefit, such as a frequency multiplication module or other frequency tunable applications. Note that the looped-stub resonator can be a metal pattern formed on the substrate, and changes in oscillation frequency can be accomplished by physically changing the metal pattern. In one such particular embodiment, the looped-stub resonator is formed on the substrate as a metal pattern that includes a capacitive termination, and changes in oscillation frequency are accomplished by physically changing the capacitive termination.

Another embodiment of the present invention provides a phase locked loop module. The module includes a voltage controlled oscillator circuit, and a fractional wavelength looped-stub resonator that is operatively coupled to the voltage controlled oscillator circuit. The looped-stub resonator has one or more loops, with each edge or side of the one or more loops providing a portion of the fractional wavelength. The looped-stub resonator provides a frequency selective element for the voltage controlled oscillator circuit.

In one such embodiment, the looped-stub resonator has a Q of 100 or greater. Note that the voltage controlled oscillator circuit and the looped-stub resonator can be located on a common substrate, or on different substrates (e.g., in a layered structure). In another particular embodiment, the module includes a number of layers and the looped-stub resonator is located on a layer that is above a dielectric insulation layer. Here, the dielectric insulation layer can be located above an electrically conducting material layer that is connected to ground.

The looped-stub resonator can be a metal pattern on a substrate, and changes in oscillation frequency can be accomplished by physically changing the metal pattern. In one such embodiment, the looped-stub resonator is on a substrate as a metal pattern that includes a capacitive termination, and changes in oscillation frequency are accomplished by physically changing the capacitive termination. In another particular embodiment, the looped-stub resonator has a resonant frequency higher than an output frequency of the module. In such a case, one or more frequency dividers can be used to reduce the resonant frequency to the output frequency.

Another embodiment of the present invention provides a phase locked loop module. The module includes a first layer having a voltage controlled oscillator circuit, and a second layer of dielectric insulating material covered with a conducting metal that is connected to a ground plane. A third layer having a fractional wavelength looped-stub resonator that is operatively coupled to the voltage controlled oscillator circuit. The looped-stub resonator has one or more loops, with each edge or side of the one or more loops providing a portion of the fractional wavelength. The resonator provides a frequency selective element for the voltage controlled oscillator circuit. A fourth layer of dielectric insulating material covered with a conducting metal that is connected to the ground plane, wherein the third layer is surrounded by the dielectric insulating material of the second and fourth layers.

In one such embodiment, the module further includes an additional layer of dielectric insulating material on the conducting metal of the second layer to prevent unintended short-circuiting between the first layer and the second layer. In another such embodiment, the looped-stub resonator has a resonant frequency that is higher than the output frequency of the module. One or more frequency dividers can be used to reduce the resonant frequency to the output frequency.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Figure 1A:
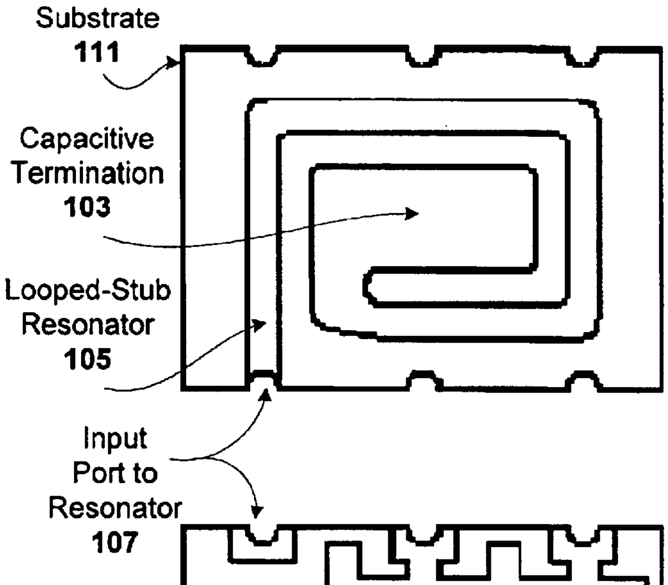
FIGS. 1*a* and 1*b* illustrate respective top and bottom views of a fractional wavelength looped-stub transmission line resonator structure configured in accordance with one embodiment of the present invention.

Embodiments of the present invention provide a transmission line configured as a looped-stub resonator that can be used as a frequency selective element for an oscillator. The transmission line is a fraction of an electrical wavelength, and can be embedded to provide an inner resonant layer of an overall layered structure. The transmission line is formed into a loop or multiple loops and may be terminated with a capacitor, short circuit, or open circuit.

One particular embodiment provides a PLL module, including a VCO that incorporates a looped-stub resonator and can operate at high frequencies. The looped-stub resonator may be part of the PLL module packaging, and is associated with a high Q (e.g., in excess of 100), thereby enabling an oscillator design with a high Q resonance. The high Q looped-stub resonator reduces the jitter and phase noise of the VCO such that the performance of the PLL module is enhanced. The PLL module base generally supports the electronic circuitry and may also serve as a dielectric insulation layer of the looped-stub resonator. The module has desirable performance characteristics while maintaining a relatively small size and low cost assembly that is mechanically robust and well-suited for volume economical production and will readily accommodate new frequency requirements.

The base or substrate of the PLL module can be made of traditional circuit board material such as epoxy-glass or Teflon-based materials. Alternatively, the base can be made of ceramic, or ceramic filled materials. Ceramic materials can be obtained which have higher dielectric and thermal conductivity constants than traditional circuit board materials. For example, aluminum oxide has a relative dielectric constant of 9.9, or about 3 times greater than epoxy glass circuit board. Other materials are also available with much higher dielectric constants, say 25 or even 100.

The dimensions of the transmission line resonator are reduced by approximately the square root of the ratio of the dielectric constants. Thus, a higher dielectric constant base material will reduce the overall module size. Since the base also conducts heat from the electronic circuitry away from the module, ceramic material will provide an additional benefit of improved heat conduction. Provision for electrical connections to the base may be made through solder connections along the edge of the package, or even on the base of the package. The transmission line resonator is a metal conductor formed into a loop pattern, or even a spiral multiple loop structure, and is referred to herein as a looped-stub resonator. The longest dimension of the resonator can be made much smaller than conventional techniques allow.

Note that conventional conducting lines printed onto a dielectric material are commonly referred to as microstrip. If the conducting lines are contained within the dielectric material, and the material is covered with a conducting ground media on the top and bottom surfaces, then the structure is referred to as a stripline. Conventional resonator structures may incorporate either stripline or microstrip. Typical resonator devices are a fraction of an electrical wavelength long, such as ¼ or ½ of the electrical wavelength. Such devices are normally fabricated as a straight line of this length and are referred to as stubs. The electrical length of such conventional stubs constrains the device to a particular size, which is often longer than is desired. The looped-stub resonator pattern described herein alleviates this problem.

Looped-Stub Resonator: Capacitive Termination

Figure 1B:
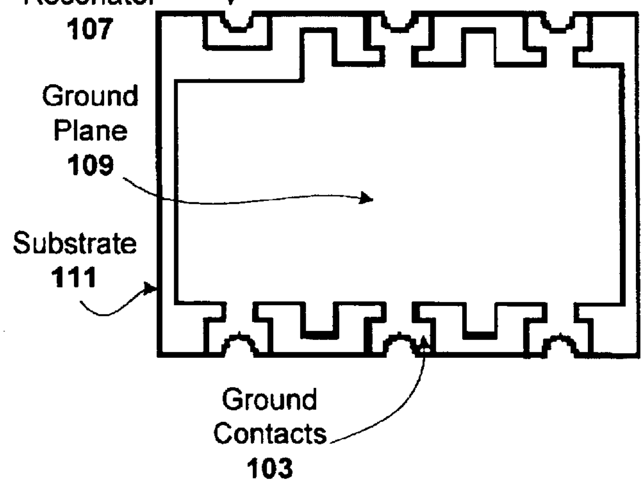

FIGS. 1*a* and 1*b* illustrate respective top and bottom views of an approximate ½ wavelength looped-stub transmission line resonator configured in accordance with one embodiment of the present invention. In this example, the looped-stub resonator 105 begins at input port 107 and is terminated with a center region of capacitance 103. The capacitance 103 arises from the central area or plate of the looped-stub resonator 105 located above the ground plane 109 of the substrate 111. Twisting the traditionally straight transmission line of ½ wavelength into a looped-stub resonator 105 allows the device to be considerably smaller in size. Each side or edge of the loop contributes to the overall length of the transmission line.

Terminating in a parallel plate capacitor 103 further reduces the required electrical length slightly from ½ wavelength and thus the overall size of the resonator 105. In addition, the magnetic energy of the resonator 105 is more contained within the structure. In particular, twisting the transmission line into a stubbed-loop resonator 105 reinforces the magnetic lines in the center of the resonator 105 in such a fashion as to form a single magnetic axis, thereby increasing the stored energy and hence the Q. This Q increase resulting from forming a loop with a transmission line fractional wavelength structure is highly desirable.

With perfect coupling of magnetic fields, the Q may increase by a factor of about 2. For example, testing has shown that the Q of a looped-stub resonator 105 can increase from 237 to 404 by changing from a conventional straight transmission line fractional wavelength structure to a looped-stub resonator configuration in accordance with the principles of the present invention. Thus, the looped-stub resonator 105 has the dual benefits of reducing the size while increasing the Q factor.

Furthermore, the spacing between adjacent transmission lines can be made approximately equal to (or greater than) the thickness of the substrate 111 without degrading the Q. This effect also diverges from the conventional practices using stub resonators, and allows the resonant structure to be further reduced in size (as opposed to increasing to accommodate a conventional resonator stub). For example, with a substrate material of 0.015 inches thick, the spacing between lines and the edge of the structure or other lines should be 0.015 or larger to maximize device Q.

Using these guidelines, a 2.5 GHz capacitively terminated looped-stub resonator 105 of approximately ½ wavelength was constructed. The device had rectangular dimensions of approximately 0.25 inches, with a total area of less than 0.050 square inches. In comparison, a conventional stripline or microstrip stub resonator built with similar materials would need to have length of nearly 1 inch, thus making it excessively large for many applications.

Note that the looped-stub resonator 105 may be terminated in the center with a capacitor (as shown), or alternatively with a short to electrical ground, or an open circuit. Each of these terminations is associated with different and useful characteristics, and can be used depending on the particular application as will be apparent in light of this disclosure.

Also, it may be desirable to adjust the frequency of oscillation after fabrication. A capacitively terminated looped-stub resonator 105 is well-suited to frequency adjustments. By using a looped-stub resonator structure for the transmission line and terminating the line with a parallel plate capacitance, the frequency of the module can be adjusted. In general, the capacitance of parallel plates is directly related of the area of the plates. By physically changing the plate area, the capacitance is changed, thereby changing the line impedance and module frequency.

With this in mind, note that substantial changes in frequency can be accomplished by changing the metal pattern of the looped-stub resonator 105 on the substrate 111. For example, the physical center area at capacitive termination 103 can readily be modified by well-known methods such as laser trimming or even physical abrasion. A variable capacitance diode at the center may also be used as a capacitive termination and a means of adjusting the frequency. MEM switches could also be used to provide a variable capacitive termination.

Looped-Stub Resonator: Short-to-Ground Termination

Figure 2:
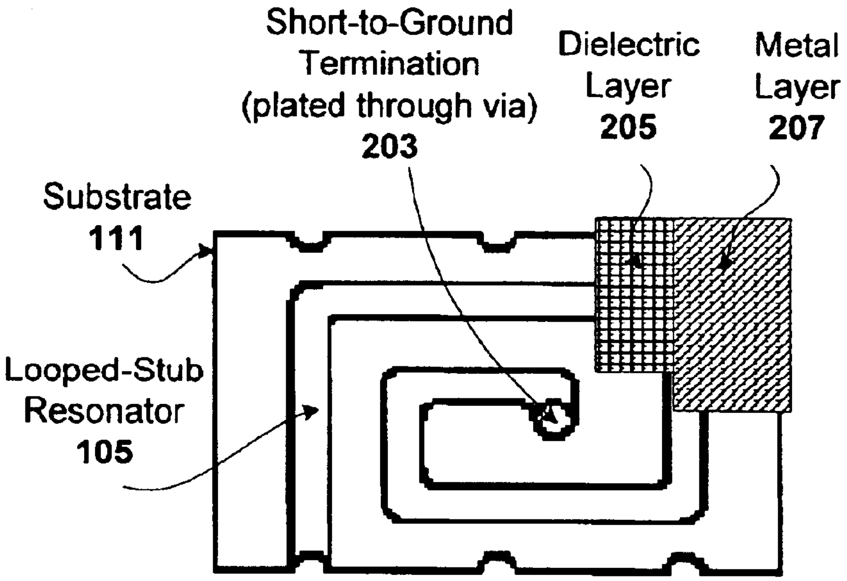
FIG. 2 illustrates a top view of a fractional wavelength looped-stub transmission line resonator structure configured in accordance with another embodiment of the present invention.

FIG. 2 illustrates an approximate ¼ wavelength looped-stub transmission line resonator configured in accordance with another embodiment of the present invention. In this example, the looped-stub resonator 105 is terminated with a short-to-ground 203. The short-to-ground 203 is made using a plated through hole or other suitable means of electrically connecting the transmission line to the ground plane 109 on the opposite surface of the substrate 111.

Here, the driven end or input port 107 of the looped-stub resonator 105 exhibits a high impedance resonance frequency when the electrical length of the line is approximately ¼ wavelength. The smallest possible size for each edge or side of a looped-stub resonator 105 will then be 1/16 of the total wavelength for the case of a single loop. The total area of the resonator will then be 1/16 multiplied by 4, or a total area of ¼ of the wavelength.

In practice, note that the looped-stub resonator 105 may need to be slightly larger than this to accommodate a connection for the electrical short to ground, and a slight gap from the edge of the lines to the edge of the device to isolate the electrical fields from the edge of the structure. This distance can be approximately equal to the substrate 111 thickness or greater. Note that the shorted-to-ground configuration produces the minimum size, while the capacitively terminated configuration can easily be adjusted for different frequencies.

Figures 4A, 4B, 4C, 4D:
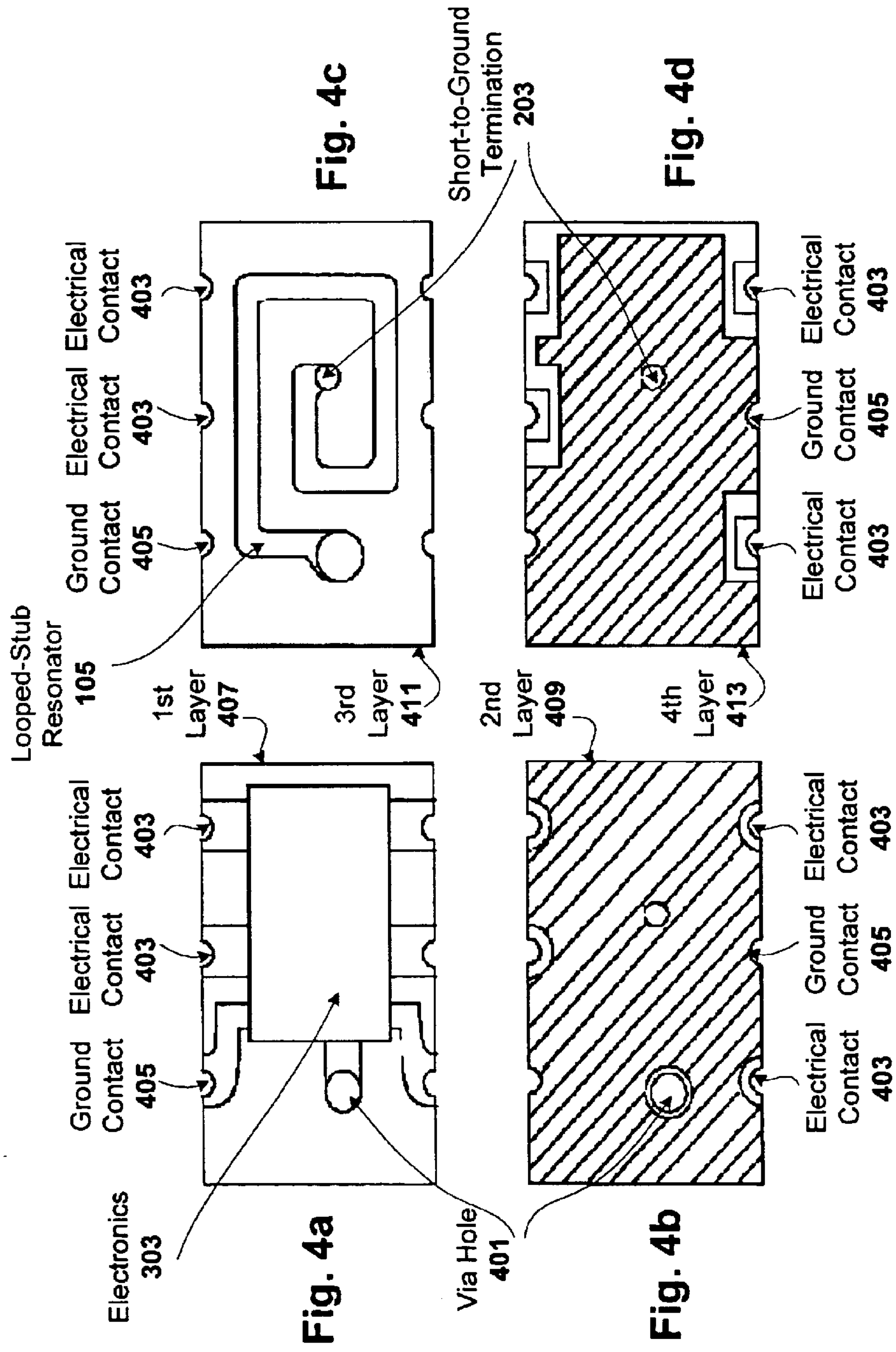
FIGS. 4*a*, 4*b*, 4*c*, and 4*d* illustrate an embedded looped-stub resonator module configured in accordance with another embodiment of the present invention.

In alternative embodiments, the looped-stub resonator transmission structures of FIGS. 1*a–b* and 2 may also be covered or "buried" between layers of dielectrically insulating material. This insulating material may also be covered with a layer of metal connected to the ground plane 109. These alternative layers are partially shown as dielectric layer 205 and metal layer 207 in FIG. 2. Such an embodiment effectively provides an embedded looped-stub resonator structure, and is discussed in more detail with reference to FIG. 4.

Frequency Generation Module

Figure 3A:
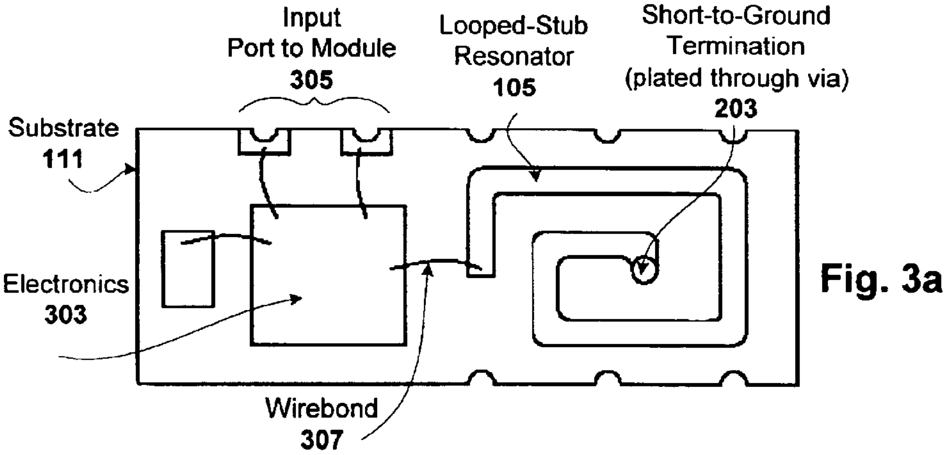
FIGS. 3*a* and 3*b* illustrate respective top and bottom views of a looped-stub resonator incorporated into a frequency generation module in accordance with another embodiment of the present invention.
Figure 3B:
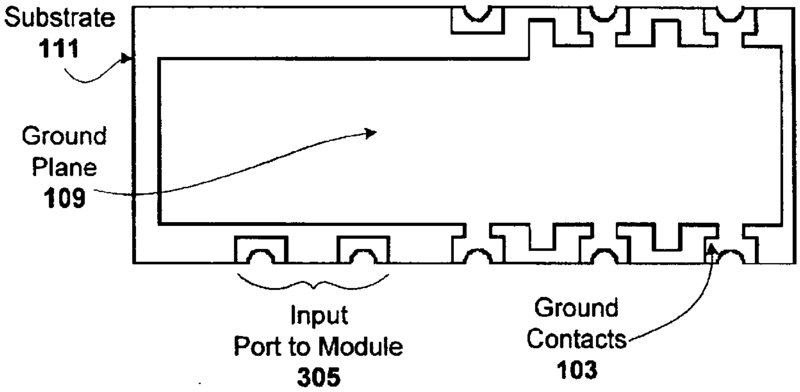

FIGS. 3*a* and 3*b* illustrate respective top and bottom views of a looped-stub resonator incorporated into a frequency generation module in accordance with another embodiment of the present invention. Electronics 303 may be located on the top surface of the module as shown. In this case, the looped-stub resonator 105 is located adjacent to the electronics 303.

Note that the electronics 303 may include one or more integrated circuits and/or discrete components such as resistors or capacitors. In one particular embodiment, electronics 303 is configured as a Colpitts oscillator or oscillator circuit topology. The looped-stub resonator 105 may be, for example, either to the ½ or ¼ wavelength structures discussed in reference to FIGS. 1*a–b* and 2. The electronics 303 operates in conjunction with the looped-stub resonator 105 to effectively provide a one port oscillator. Note, however, that other electronics can also be included in the electronics 303, such as phase locked loop circuitry.

Signals are received by the module at input ports 305, which are electrically connected to the circuitry 303 by way of wirebonds 307 or the like. Similarly, electrical connections can be made between the electronics 303 and the looped-stub resonator 105 through wirebonds 307. Alternative electrical connection include, for example, metal traces on the top surface of the substrate 111 can be used to electrically connect electronics 303 and the looped-stub resonator 105. Likewise, electrical connections are made between the electronics 303 and the module base or substrate 111 by metal traces, wirebonds, solder and/or other well-known methods connection techniques.

This particular embodiment employs a short-to-ground termination 203, where the looped-stub resonator 105 is terminated to the ground plane 109 by a plated through via. Also demonstrated in FIG. 4 is a wrap-around edge connection which is using plated through half-holes to couple top and bottom surfaces as needed (e.g., to couple ground contacts 103 on the bottom to a ground plane on top). Other well-known methods may be used to connect from the top surface to the substrate 111 which may result in a ball-grid-array package. The module substrate 111 or base material may be, for example, ceramic, epoxy glass material, ceramic filled Teflon materials or other appropriate dielectric and insulating materials.

Embedded Looped-Stub Resonator

In alternative embodiments, the looped-stub resonator transmission structures of FIGS. 1*a–b*, 2, and 3 may also be buried between two layers of ground with dielectric insulation.

Conventional transmission line conductors that are buried between two layers of ground with dielectric insulation are commonly referred to as stripline. By utilizing a similar layered construction to fabricate a looped-stub resonator structure in accordance with the principles of this invention, a substantial reduction in size results as compared to conventional structures. The size reduction benefits are similar to that described previously, but the added capacitance from the additional layers of dielectric insulation and ground plane provide a slight further reduction in size when operating at the same frequency.

A further benefit of this layered looped-stub resonator construction is that the Q will be further increased. In more detail, burying the looped-stub resonator 105 within a layer of dielectric insulation and ground plane substantially reduces radiated electromagnetic energy. Eliminating this source of loss will increase the Q of the resonator structure by a factor of 2 or more.

FIGS. 4*a–d* collectively illustrate an embedded looped-stub resonator module configured in accordance with another embodiment of the present invention. This particular module includes four layers (407, 409, 411, and 413), and the looped-stub resonator 105 is located in the interior of the module base (on layer 411, between layers 409 and 413), thereby providing a buried or embedded resonator layer. The resonator 105 can be, for example, the ½ or ¼ wavelength looped-stub resonator discussed in reference to FIGS. 1*a–b* and 2.

As can be seen, the top layer 407 includes electronics 303, which is electrically connected to via 401 and a number of electrical contacts 403 and ground contacts 405. The previous discussion on techniques for making such electrical and ground contacts (e.g., metal traces, wirebonds, solder) is equally applicable here. Note that the looped-stub resonator 105 is on a different layer than the electronics 303 in this particular embodiment, thereby allowing the resonator 105 to be incorporated into an inner resonant layer of the module.

The second layer 409 and the fourth layer 413 each include dielectric and ground portions. The looped-stub resonator 105 is on layer 411, and is generally surrounded by the dielectric and then ground portions of the second and fourth layers. The dielectric portions of second layer 409 and the fourth layer 413 effectively separate the resonator 105 layer from other metal layers in the module. Plated through via holes and plated half-holes enable desired connection between the layers. The fourth layer 413 can then be electrically coupled to another circuit or system.

Variations will be apparent in light of this disclosure. For example, the ground portion of the second layer 409 can be further covered with an additional dielectric layer to prevent unintended short-circuiting between the first layer 407 and the second layer 409.

Phase Locked Loop Module

Figure 5:
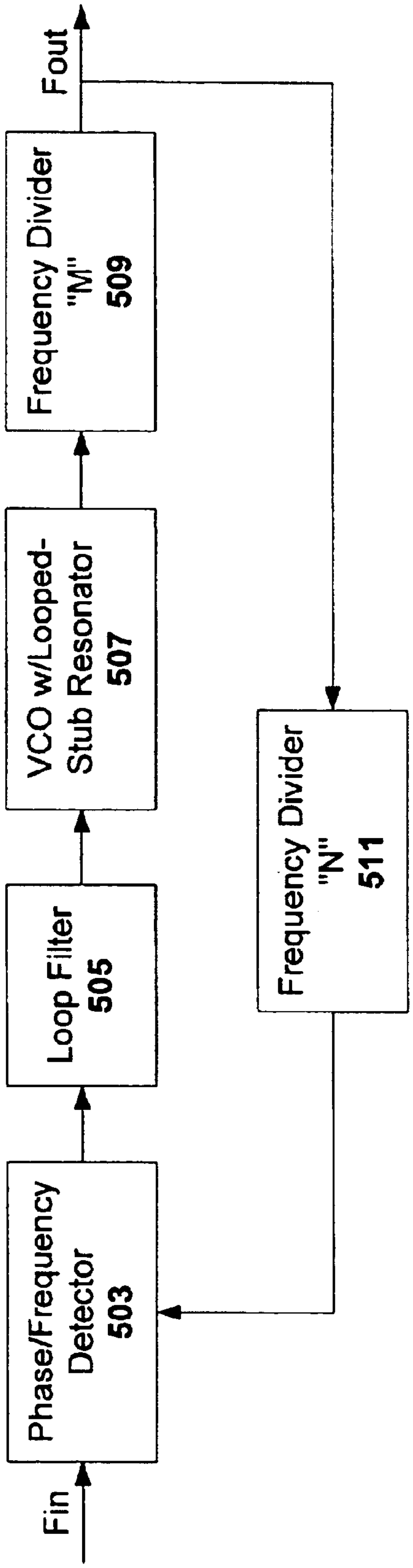
FIG. 5 illustrates a PLL module configured in accordance with an embodiment of the present invention.

FIG. 5 illustrates a PLL module configured in accordance with an embodiment of the present invention. The module includes a phase/frequency detector 503, a loop filter 505, a VCO 507, a frequency divider M 509, and a frequency divider N 511. The VCO 507 includes a high Q looped-stub resonator as discussed herein. As previously explained, the looped-stub resonator may be operated at a higher frequency than the output frequency of the module.

VCO 507 can be implemented, for example, as a Colpitts oscillator topology with an integrated looped-stub resonator as previously explained. The phase/frequency detector 503, loop filter 505, frequency divider M 509, and frequency divider N 511 can each be implemented in conventional technology. Numerous PLL configurations and embodiments will be apparent in light of this disclosure, and the present invention is not intended to be limited to any particular one.

The area of the looped-stub resonator of the VCO 507 is inversely proportional to the square of the operating frequency, so that increasing the frequency of the looped-stub resonator element causes a substantial reduction in area. For the example case of a single loop, each doubling of the frequency causes the required area to reduce by approximately $1/4^{th}$.

As shown in FIG. 5, the divider M 509 is placed inside the feedback loop and serves to increase the operating frequency of the looped-stub resonator and VCO 507. An electrical signal is injected into the PLL module at a specified input frequency, Fin. This input frequency is then be transferred to the output frequency, Fout, at a specified multiple of N/M.

By including the M divider 509 into the module, the total area of the module is reduced in size by approximately M squared. For example, consider a case where Fin is equal to 150 MHz, N is equal to 4, and Fout is equal to 600 MHz such that the VCO 507 will operate at 2.4 GHz. For this case, the total area consumed by the PLL module will be only 1/16 of what would be required for a module that operated the VCO at 600 MHz and without the M divider 509. As such, the total size is dramatically reduced by inclusion of the M divider 509. Incorporating the M divider 509 into the PLL module also provides the benefit of closely controlling the phase shift from Fin to Fout.

Thus, a miniature PLL frequency generation module is enabled, which is fabricated using a high Q looped-stub resonator element with total dimensions that are compatible with integrated circuit packaging. The total dimensions of frequency generation modules which incorporate a looped-stub resonator element are comparable to the dimensions of packaged integrated circuits which do not include conventional high Q transmission line resonators, which are too large for such packaging. The resulting PLL module can meet various frequency requirements with only a minor redesign of the looped-stub resonator element dimensions. Note that the module may be implemented, for example, in bipolar, BiCMOS, CMOS, or other semiconductor technology. In addition, the module may be integrated into one or more integrated circuits made of semiconducting materials.

Embodiments of the present invention were discussed in the context of oscillators and phase locked loops. However, other applications may also benefit from the principles of the present invention. For instance, a frequency multiplication module is enabled, where certain passive elements such as resistors or bypass capacitors are located on a base or substrate incorporating a looped-stub resonator. The module can be "tuned" to produce desired output frequencies. Other tuned circuit applications will be apparent in light of this disclosure.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A resonator device configured with an input port at one end and a termination at its other end, and for providing a frequency selective element for an oscillator, the device comprising:

a substrate having a thickness between its two outer planar surfaces; and a fractional wavelength transmission line on one of the surfaces of the substrate, and formed into more than one loop thereby providing a spiral shaped looped-stub resonator structure, wherein adjacent conductor runs of the more than one loop are a predetermined distance from one another to isolate electrical fields between runs, the predetermined distance equal to or greater than the thickness of the substrate.

2. The device of claim 1 wherein the termination is one of a capacitor, a short circuit, or an open circuit.

3. The device of claim 1 wherein the device is a structure having a number of layers, and the transmission line is located in an inner layer of the structure.

4. The device of claim 3 wherein the inner layer is substantially surrounded by dielectric insulating material layers.

5. The device of claim 4 wherein electrically conducting material layers connected to ground surround the dielectric insulating material layers.

6. The device of claim 1 wherein the device is incorporated into a voltage controlled oscillator of a phase locked loop circuit.

7. The device of claim 1 wherein the looped-stub resonator is a metal pattern formed on the substrate, and changes in oscillation frequency are accomplished by physically changing the metal pattern.

8. The device of claim 1 wherein the looped-stub resonator is formed on the substrate as a metal pattern that includes a capacitive termination, and changes in oscillation frequency are accomplished by physically changing the capacitive termination.

9. A phase locked loop module comprising:

a voltage controlled oscillator circuit; and a fractional wavelength looped-stub resonator located on a substrate having a thickness and operatively coupled to the voltage controlled oscillator circuit and having more than one loop thereby providing a spiral shaped loop, the resonator for providing a frequency selective element for the voltage controlled oscillator circuit;

wherein adjacent conductor runs of the more than one loop are a predetermined distance from one another to isolate electrical fields between runs, the predetermined distance equal to or greater than the thickness of the substrate.

10. The module of claim 9 wherein the looped-stub resonator has a Q of 100 or greater.

11. The module of claim 9 wherein the voltage controlled oscillator circuit and the looped-stub resonator are located on a common substrate.

12. The module of claim 9 wherein the voltage controlled oscillator circuit and the looped-stub resonator are located on different substrates.

13. The module of claim 9 wherein the module includes a number of layers and the looped-stub resonator is located on a layer that is above a dielectric insulation layer.

14. The module of claim 13 wherein the dielectric insulation layer is located above an electrically conducting material layer that is connected to ground.

15. The module of claim 9 wherein the looped-stub resonator is terminated with one of a capacitor, a short circuit, or an open circuit.

16. The module of claim 9 wherein the looped-stub resonator is a metal pattern on a substrate, and changes in oscillation frequency are accomplished by physically changing the metal pattern.

17. The module of claim 9 wherein the looped-stub resonator is on a substrate as a metal pattern that includes a capacitive termination, and changes in oscillation frequency are accomplished by physically changing the capacitive termination.

18. The module of claim 9 wherein the looped-stub resonator has a resonant frequency higher than an output frequency of the module.

19. The module of claim 18 wherein one or more frequency dividers are used to reduce the resonant frequency to the output frequency.

20. A phase locked loop module comprising:

a first layer having a voltage controlled oscillator circuit;

a second layer of dielectric insulating material covered with a conducting metal that is connected to a ground plane;

a third layer having a fractional wavelength looped-stub resonator operatively coupled to the voltage controlled oscillator circuit and having one or more loops, with each edge or side of the one or more loops providing a portion of the fractional wavelength, the resonator for providing a frequency selective element for the voltage controlled oscillator circuit; and a fourth layer of dielectric insulating material covered with a conducting metal that is connected to the ground plane;

wherein the third layer is surrounded by the dielectric insulating material of the second and fourth layers.

21. The module of claim 20 further comprising:

an additional layer of dielectric insulating material on the conducting metal of the second layer to prevent unintended short-circuiting between the first layer and the second layer.

22. The module of claim 20 wherein the looped-stub resonator has a resonant frequency higher than an output frequency of the module.

23. The module of claim 22 wherein one or more frequency dividers are used to reduce the resonant frequency to the output frequency.

* * * * *